US008416014B2

(12) United States Patent
Romero

(10) Patent No.: US 8,416,014 B2
(45) Date of Patent: *Apr. 9, 2013

(54) SWITCHED CAPACITOR NOTCH FILTER WITH FAST RESPONSE TIME

(75) Inventor: Hernan D. Romero, Buenos Aires (AR)

(73) Assignee: Allegro Microsystems, Inc., Worcester, MA (US)

( * ) Notice: Subject to any disclaimer, the term of this patent is extended or adjusted under 35 U.S.C. 154(b) by 241 days.

This patent is subject to a terminal disclaimer.

(21) Appl. No.: 12/722,753

(22) Filed: Mar. 12, 2010

(65) Prior Publication Data

US 2011/0221518 A1 Sep. 15, 2011

(51) Int. Cl.
H03K 5/00 (2006.01)

(52) U.S. Cl. .......... 327/556; 327/554; 327/552

(58) Field of Classification Search ........... 327/551–559
See application file for complete search history.

(56) References Cited

U.S. PATENT DOCUMENTS

| | | | |
|---|---|---|---|
| 4,593,250 | A | 6/1986 | Lucas et al. |
| 4,835,482 | A * | 5/1989 | Tamakoshi et al. ........... 327/554 |
| 5,327,092 | A | 7/1994 | Inogai et al. |
| 5,331,218 | A | 7/1994 | Moody et al. |
| 5,514,997 | A * | 5/1996 | Quinn ........................... 327/554 |
| 5,621,319 | A | 4/1997 | Bilotti et al. |
| 6,107,871 | A | 8/2000 | Shin |
| 6,301,965 | B1 | 10/2001 | Chu et al. |
| 6,320,459 | B2 | 11/2001 | McCullough |
| 6,559,689 | B1 | 5/2003 | Clark |
| 6,995,606 | B2 | 2/2006 | Bilotti et al. |
| 7,292,095 | B2 | 11/2007 | Burt et al. |
| 7,425,821 | B2 | 9/2008 | Monreal et al. |
| 7,495,508 | B2 | 2/2009 | Tan |
| 7,605,647 | B1 | 10/2009 | Romero et al. |
| 7,990,209 | B2 * | 8/2011 | Romero ........................ 327/556 |
| 2007/0170981 | A1 | 7/2007 | Burt et al. |
| 2007/0247141 | A1 | 10/2007 | Pastre et al. |
| 2010/0321105 | A1 | 12/2010 | Romero |

FOREIGN PATENT DOCUMENTS

JP 59 122216 A 7/1984

OTHER PUBLICATIONS

Notification of and International Search Report and Written Opinion of the International Searching Authority for PCT/US2010/034173, dated Aug. 25, 2010, 19 pages.
Brandao, et al. "Switched Capacitor Hadamard Filter Bank in 0.35 µm CMOS". 48$^{th}$ Midwest Symposium on Circuits and Systems, Aug. 7, 2005, pp. 1641-1644, XP010893899.
Saad, "Switched Capacitor Circuits and their Applications an Overview", Radio Science Nineteenth National Conference, Mar. 19, 2002, pp. 51-59, XP010596126.
Haig, et al., "Some Developments towards analogue CMOS VLSI design", 19890101, Jan. 1, 1989, pp. 3/1-3/13, XP006525671.
U.S. Appl. No. 12/487,965, filed Jun. 19, 2009, file from Aug. 17, 2010 through Jun. 3, 2011, 200 pages.

(Continued)

Primary Examiner — Dinh T. Le
(74) Attorney, Agent, or Firm — Daly, Crowley, Mofford & Durkee, LLP

(57) ABSTRACT

A switched capacitor notch filter for sampling an input signal using multiple sampling capacitors during multiple non-overlapping time periods. The charge from one set of sampling capacitors is averaged and transferred to the filter output during one non-overlapping time and the charge from another set of sampling capacitors is averaged and transferred to the filter output during a second non-overlapping time period.

24 Claims, 12 Drawing Sheets

OTHER PUBLICATIONS

Viswanathan et al.; "Increasing the Clock Frequency of Switched-Capacitor Filters;" Electronics Letters, vol. 16, No. 9; Apr. 24, 1980; pp. 316-317.
PCT Search Report of the ISA dated Jul. 6, 2011 for PCT Pat. App. No. PCT/US/2011/022831; 5 pages.
PCT Written Opinion of the ISA dated Jul. 6, 2011 for PCT Pat. App. No. PCT/US/2011/022831; 5 pages.
Downloaded Jul. 13, 2011 for the timeframe of Jun. 4, 2011 to Jul. 13, 2011; for U.S. Appl. No. 12/487,965; 27 pages.
U.S. Appl. No. 12/487,965, filed Jun. 19, 2009, file through Jun. 3, 2010, 221 pages.
U.S. Appl. No. 12/487,965, Hernan D. Romero, filed Jun. 19, 2009, 43 pages.
R. Jacob Baker, "CMOS, Circuit Design, Layout, and Simulation", Second Edition, IEEE Press Series on Microelectronic Systems, A John Wiley & Sons, Inc. Publication, 2005, 7 pages.
Notification and International Preliminary Report on Patentability (Form PCT/IB/373) and Written Opinion (Form PCT/IB/237) for PCT/US2011/022831, dated Sep. 27, 2012, 7 pages.
U.S. Appl. No. 12/487,965, filed Jun. 19, 2009, file from Jun. 3, 2010 through Aug. 16, 2010, 13 pages.

* cited by examiner

SWITCHED CAPACITOR NOTCH FILTER WITH FAST RESPONSE TIME

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electronic filters and, more particularly, to electronic notch filters which include sampling and averaging functions.

BACKGROUND OF THE INVENTION

Notch filters are often used to remove unwanted signal components within a specific frequency range for a particular circuit. One application for a notch filter is in chopper stabilized Hall effect sensors, in which a notch filter, sometimes referred to as a sinc filter, may be used to remove unwanted components, such as a modulated offset signal component which arises as ripple, that result from the chopping operation without requiring a multi-pole filter approach that may result in unacceptable time delays to the sensor output signal. Offset in a sensor is undesirable as it may limit the minimum detectable signal of the sensor. One such arrangement is described in a U.S. Pat. No. 7,425,821 entitled "Chopped Hall Effect Sensor" which issued on Sep. 16, 2008 to Allegro MicroSystems, Inc. of Worcester, Mass., the Assignee of the subject invention.

Some notch filters sample and average an input signal. A typical implementation may use two sampling stages to avoid excessive residual harmonic components. The first stage performs a sample and hold function at some time. A second stage samples the output of the first stage at a ninety degree phase shift with respect to the first stage, so as to avoid the dV/dt generated from the non-ideal sampling pulses in the first stage. The output of the second sampling stage is fed into the averaging stage, which may employ resistive averaging, multi-gate/base averaging, or charge redistribution averaging techniques. The first two approaches are continuous time approaches and charge redistribution is a discrete time approach. The continuous time approaches generally require two sampling stages, relatively large sampling capacitor sizes, such as on the order of 4-10 picofarads, and an output buffer for isolating the sampling stages from the averaging stage which may consume a significant area. This buffer stage—as well as the averaging stage—may introduce offset to the circuit. In addition the buffer stage may not be suited for dynamically cancelling its offset contribution to the circuit. The charge distribution discrete time approach uses the second sampling stage as the charge redistribution averaging stage and also requires relatively large sampling capacitor sizes, such as on the order of 4-10 picofarads, and an output buffer for isolating the capacitors holding the averaged signal from the remainder of the circuit, which output buffer may also be area consuming and not suited for using dynamic offset cancellation techniques for removing its offset contribution to the circuit.

In U.S. patent application Ser. No. 12/487,965 entitled "Switched Capacitor Notch Filter" which was filed on Jun. 19, 2009 and assigned to Allegro MicroSystems, Inc. of Worcester, Mass., the assignee of the present invention, a sampling and averaging notch filter is described in which charge from the sampling capacitors is simultaneously averaged and transferred to the filter output, thereby eliminating the need for conventional buffering between sampling and averaging stages and the associated drawbacks. However, certain response time limitations may exist due to the use of a fixed feedback capacitor.

Other notch filters sample and integrate (rather than averaging) an input signal, such as a chopped signal synchronized with the chopper clock in such a way that the unwanted ripple resulting from the chopper operation is integrated to zero over each chopper clock period. However, the accuracy of this approach highly depends on the integrating clocks phases relative to the chopper clock, and is also susceptible to the sampling non-ideal effects like charge injection and clock feed-through, such effects being reduced if averaging is used instead.

A post-filter stage may be required when using a notch filter in order to further attenuate high frequency residual components not removed (or generated) by the notch filter. As one example, the post-filter stage may be implemented with a low pass filter topology, which may consist of a resistor in parallel with a fixed capacitor in an operational amplifier feedback network. This resistor may be implemented with a switched capacitor topology to reduce the size of the circuit.

SUMMARY OF THE INVENTION

A switched capacitor notch filter according to the invention includes a first sampling capacitor, a second sampling capacitor, a third sampling capacitor, a fourth sampling capacitor, and an operational amplifier. Each sampling capacitor is coupled to a respective set of switches that are controlled such that the third and fourth sampling capacitors are connected in parallel between a common node and the output node of the amplifier during a first time period and during a second, non-overlapping time period the first and second sampling capacitors are connected in parallel between the common node and the output node of the amplifier. The switches are further controlled such that during a third time period, the first sampling capacitor is charged by the input to the filter, during a fourth time period the second sampling capacitor is charged by the input to the filter, during a fifth time period the third sampling capacitor is charged by the filter input, and during a sixth time period the fourth sampling capacitor is charged by the filter input.

In general, the filter includes at least two sampling and averaging portions comprising at least two switched capacitor sampling networks, with each such network comprising a respective sampling capacitor and associated switches, and an operational amplifier. In some embodiments, the sampling and averaging portion may include two switched capacitor sampling networks, while in other embodiments the sampling and averaging portion may include more than two switched capacitor sampling networks.

With this arrangement, the charge from a first set of at least two sampling capacitors is simultaneously averaged and transferred to the amplifier output during one time period while the input is sampled by a second set of at least two sampling capacitors in separate time periods that overlap with the first time period, and during a second time period the charge from the second set of at least two sampling capacitors is simultaneously averaged and transferred to the amplifier output, while the input is sampled by the first set of at least two sampling capacitors in separate time periods that overlap with the second time period, thereby eliminating the need for an averaging clock cycle or conventional buffering between sampling and averaging stages of a notch filter and the associated drawbacks.

In other embodiments, a fifth and sixth sampling capacitor and associated set of control switches are added to the filter such that the fifth and sixth sampling capacitors are connected in parallel between the common node and the output node of the amplifier during a third time period that is non-overlapping with the first and second time periods. The switches are further controlled such that during a fourth time period, the third and fifth sampling capacitors are charged by the input to the filter, during a fifth time period the first and sixth sampling capacitors are charged by the input to the filter, during a sixth time period the second and fourth sampling capacitors are charged by the filter input.

Reference switches are provided to selectively couple terminals of each sampling capacitor to reference nodes. In some embodiments, a common reference voltage is provided at the reference nodes.

In differential implementations, the switched capacitor notch filter also includes a first differential sampling capacitor, a second differential sampling capacitor, a third differential sampling capacitor, a fourth differential sampling capacitor, and a differential operational amplifier. Each sampling capacitor and differential sampling capacitor is coupled to a respective set of switches that are controlled such that the third and fourth sampling capacitors are connected in parallel between the common node and a first output node of the differential amplifier and the third and fourth differential sampling capacitors are connected in parallel between a differential common node and a second output node of the differential amplifier and the during a first time period and during a second, non-overlapping time period the first and second sampling capacitors are connected in parallel between the common node and the first output node of the differential amplifier and the first and second differential sampling capacitors are connected in parallel between the differential common node and the second output node of the differential amplifier. The switches are further controlled such that during a third time period, the first sampling capacitor and first differential sampling capacitor are charged by the input and the differential input to the filter respectively, during a fourth time period the second sampling capacitor and second differential sampling capacitor are charged by the input and differential input to the filer respectively, during a fifth time period the third sampling capacitor and third differential sampling capacitor are charged by the filter input and differential input respectively, and during a sixth time period the fourth sampling capacitor and fourth differential sampling capacitor are charged by the filter input and differential input respectively.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
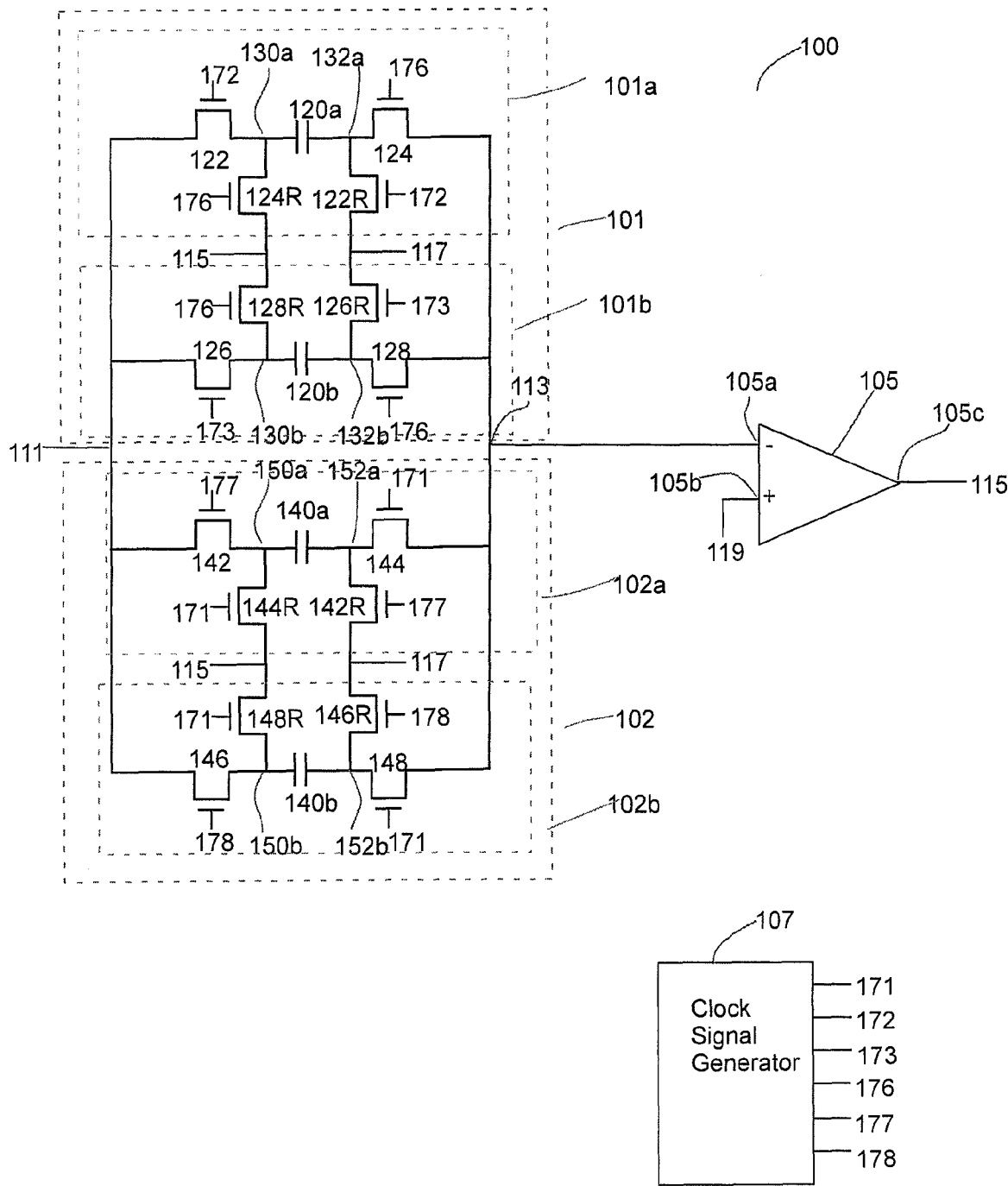
FIG. 1 is a schematic of a switched capacitor notch filter according to the invention.

Referring to FIG. 1, a single-ended switched capacitor notch filter 100 includes an input node 111 adapted for receiving input signal 181 (FIG. 1D), at least two sampling and averaging portions 101, 102, a common node 113, and an amplifier 105 which has an output node 105c providing the filter output node, a negative input node 105a which is coupled to common node 113, and a positive input node 105b which is connected to a reference voltage, for example ground or some voltage value above ground based on the particular circuit design. Each sampling and averaging portion 101 and 102 includes at least two switched capacitor sampling networks 101a, 101b, and 102a, 102b, respectively. The number of sampling networks in each portion 101, 102 corresponds to the number of input signal samples that are processed (i.e., averaged). For example, in the case where four samples are averaged, each sampling portion 101, 102 would each have four sampling networks for a total of eight sampling capacitors in the filter. Examples of a notch filter sampling and averaging portion containing more than two sampling networks are described in the above referenced U.S. patent application Ser. No. 12/487,965 and in connection with FIGS. 1E and 1F below.

Each switched capacitor sampling network 101a, 101b, 102a, 102b comprises a respective sampling capacitor and associated switches. More particularly, the first switched capacitor sampling network 101a includes a first sampling capacitor 120a and associated switches 122, 122R, 124, and 124R; the second switched capacitor sampling network 101b includes a second sampling capacitor 120b and associated switches 126, 126R, 128, and 128R; the third switched capacitor sampling network 102a includes a third sampling capacitor 140a and associated switches 142, 142R, 144, and 144R; and the fourth switched capacitor sampling network 102b includes a fourth sampling capacitor 140b and associated switches 146, 146R, 148, and 148R. The first sampling capacitor 120a has a first terminal 130a coupled to a first switch 122 to selectively couple the first sampling capacitor to the input node 111 and a second terminal 132a coupled to a second switch 124 to selectively couple the first sampling capacitor to the common node 113. The second terminal 132a of the first sampling capacitor 120a is also selectively coupled to a reference node 117 by a first reference switch 122R. The first terminal 130a of the first sampling capacitor 120a is selectively coupled to the output node 105c of the amplifier 105 by a second reference switch 124R.

The second sampling capacitor 120b has a first terminal 130b coupled to a third switch 126 to selectively couple the second sampling capacitor 120b to the input node 111 and a second terminal 132b coupled to a fourth switch 128 to selectively couple the second sampling capacitor 120b to the common node 113. The second terminal 132b of the second sampling capacitor 120b is also selectively coupled to the reference node 117 by a third reference switch 126R. The first terminal 130b of the second sampling capacitor 120b is selectively coupled to the output node 105c of the amplifier 105 by a fourth reference switch 128R.

The third sampling capacitor 140a has a first terminal 150a coupled to a fifth switch 142 to selectively couple the third sampling capacitor to the input node 111 and a second terminal 152a coupled to a sixth switch 144 to selectively couple the third sampling capacitor 140a to the common node 113. The second terminal 152a of the third sampling capacitor 140a is also selectively coupled to the reference node 117 by a fifth reference switch 142R. The first terminal 150a of the third sampling capacitor 140a is selectively coupled to the output node 105c of the amplifier 105 by a sixth reference switch 144R.

The fourth sampling capacitor 140b has a first terminal 150b coupled to a seventh switch 146 to selectively couple the fourth sampling capacitor 140b to the input node 111 and a second terminal 152b coupled to an eighth switch 148 to selectively couple the fourth sampling capacitor 140b to the common node 113. The second terminal 152b of the fourth sampling capacitor 140b is also selectively coupled to the reference node 117 by a seventh reference switch 146R. The first terminal 150b of the second sampling capacitor 140b is selectively coupled to the output node 105c of the amplifier 105 by an eighth reference switch 148R.

The filter 100 further includes a clock signal generator 107 adapted to provide clock signals for controlling the various switches. In particular, a first clock signal 171 is provided to close the sixth switch 144, the sixth reference switch 144R, eighth switch 148 and the eighth reference switch 148R during a first portion of each clock signal.

The clock signal generator 107 further provides a second clock signal 172 to close the first switch 122 and the first reference switch 122R during a third portion of each clock cycle and a third, non-overlapping clock signal 173 to close the third switch 126 and the third reference switch 126R during a fourth portion of each clock cycle. Clock signals 172 and 173 are both active during the time clock signal 171 is active.

The clock signal generator further provides a fourth clock signal 176 to close the second switch 124, the second reference switch 124R, the fourth switch 128 and the fourth reference switch 128R during a second portion of each clock cycle. A fifth clock signal 177 is provided to close the fifth switch 142 and the fifth reference switch 142R during a fifth portion of each clock cycle and a sixth, non-overlapping clock signal 178 to close the seventh switch 146 and the seventh reference switch 146R during a sixth portion of each clock cycle. Clock signals 177 and 178 are both active during the time clock signal 176 is active.

In operation, during a first portion of each clock cycle the sampling capacitors 120a, 120b are alternately charged during non-overlapping time periods while capacitors 140a, 140b are averaged and their averaged charge transferred to the filter output. Similarly, during a second portion of each clock cycle (that is non-overlapping with respect to the first portion), sampling capacitors 140a, 140b are alternately charged during non-overlapping time periods while charge in capacitors 120a, 120b are averaged and their averaged charge transferred to the filter output.

Figure 1A:
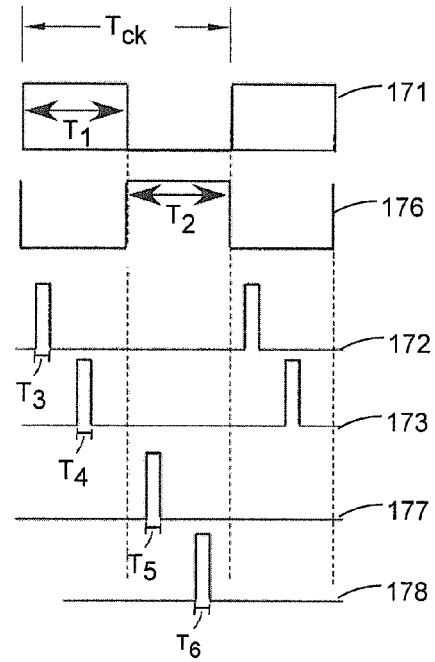
FIG. 1A shows illustrative clock signals for the filter of FIG. 1.
Figure 1B:
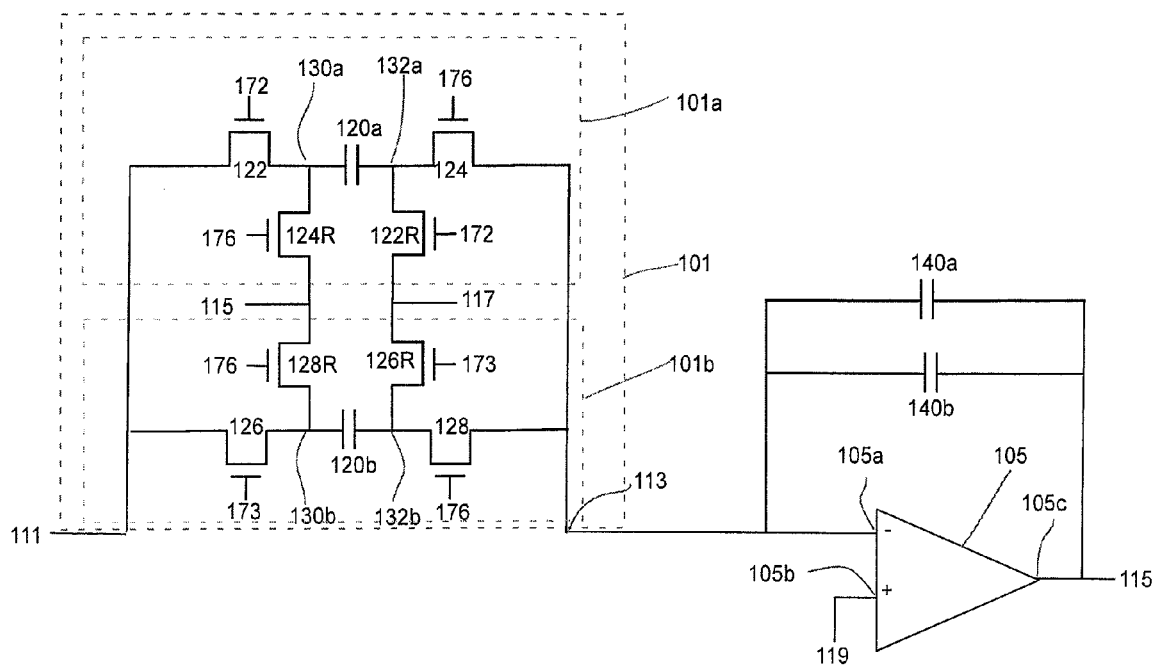
FIG. 1B is a schematic of the switched capacitor notch filter in FIG. 1 during a first state of operation.
Figure 1C:
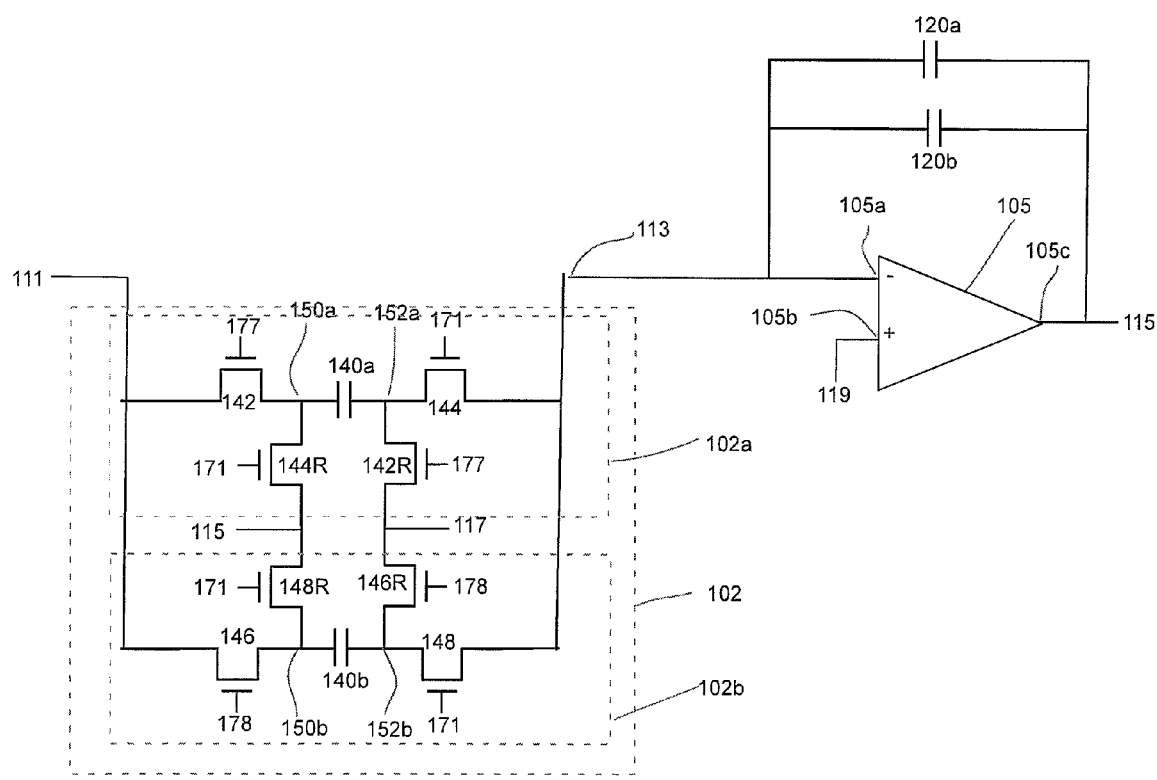
FIG. 1C is a schematic of the switched capacitor notch filter in FIG. 1 during a second state of operation.
Figure 1D:
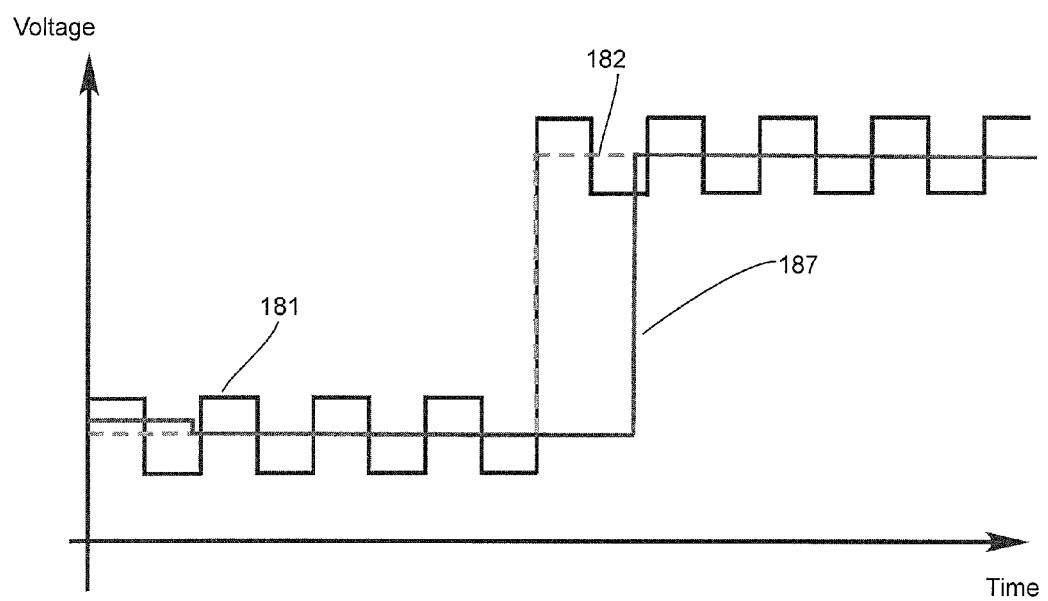
FIG. 1D shows an example of an input and output signal to the filter.

Referring to FIGS. 1A and 1D, illustrative switch control signals are shown along with an illustrative filter input signal 181 for coupling to input node 111, the averages 182 of the current period input signal that is transferred to the output during the next averaging phase of the clock cycle, and an illustrative filter output signal 187 provided at filter output node 105c.

During a first portion $T_1$ of each clock cycle $T_{ck}$ (herein the first time period), the first clock signal 171 is in a logic state, here high, to close controlled switches 144, 144R, 148, 148R. It is during the first time period $T_1$ that the charge on the third and fourth sampling capacitors 140a, 140b is averaged as the charge is simultaneously transferred from the sampling capacitors to the filter output 115. In other words, during the first time period, sampling capacitors 140a, 140b are coupled in parallel from the common node 113 to the amplifier output 115 so that the feedback network of the operational amplifier 105 includes the sampling capacitors 140a, 140b coupled between the amplifier input node 105a and output node 105c, as is shown in FIG. 1B.

During a second portion $T_2$ of each clock cycle (herein the second time period) the second clock signal 176 is in a logic state, here high, to close controlled switches 124, 124R, 128, 128R. It is during the second time period $T_2$ that the charge on the first and second sampling capacitors 120a, 120b is averaged as the charge is simultaneously transferred from the sampling capacitors to the filter output 115. In other words, during the second time period, sampling capacitors 120a, 120b are coupled in parallel from the common node 113 to the amplifier output 115 so that the feedback network of the operational amplifier 105 includes the sampling capacitors 120a, 120b coupled between the amplifier input node 105a and output node 105c, as is shown in FIG. 1C.

During a third portion $T_3$ of each clock cycle (herein the third time period) which occurs during the first time period $T_1$, clock signal 172 closes switches 122 and 122R. Thus, during the third time period $T_3$, the first sampling capacitor 120a is coupled between the input node 111 and the reference node 117.

During a fourth portion $T_4$ of each clock cycle $T_{ck}$ (herein the fourth time period), the fourth clock signal 173 is in a logic state, here high, to close controlled switches 126, 126R. Thus, during the fourth time period $T_4$, the second sampling capacitor 120b is coupled to the input node 111 and the reference node 117. Thus, during the third time period $T_3$, sampling capacitor 120a is charged by the input signal 181 and during the fourth time period $T_4$, sampling capacitor 120b is charged by the input signal 181.

During a fifth portion of each clock cycle $T_5$ (herein the fifth time period), which occurs during the second time period $T_2$, clock signal 177 closes switches 142 and 142R. Thus, during the fifth time period $T_5$, the third sampling capacitor 140a is coupled between the input node 111 and the reference node 117.

During a sixth portion $T_6$ of each clock cycle $T_{ck}$ (herein the sixth time period) the sixth clock signal 178 is in a logic state, here high, to close controlled switches 146, 146R. Thus, during the sixth time period $T_6$, the fourth sampling capacitor 140b is coupled to the input node 111 and the reference node 117. Thus, during the fifth time period $T_5$, sampling capacitor 140a is charged by the input signal 181 and during the sixth time period $T_6$, sampling capacitor 140b is charged by the input signal 181.

The above-described notch filter 100 may, in addition to providing filtering of signals having a predetermined frequency (i.e., the notch functionality), provide a low-pass filter characteristic since the sampling capacitors are connected between the output node and a reference voltage during time periods $T_1$ and $T_2$. The low pass filter characteristic should be as wideband as possible to minimize the response time of the filter output 115 to changes of the filter input 111.

Typical capacitor values for capacitors 120a, 120b, 140a, and 140b are on the order of 0.1 to 1 pF. The sampling capacitor values used in the present invention may be made smaller compared to prior capacitors discussed in the background, which results in an area saving, than those of a typical two stage sampling and averaging circuit because the capacitors in the present invention are floating as in the stray insensitive arrangement used for switched capacitors.

The operating frequency, averaging frequency, or notch frequency, $f_{ck}$, of the notch filter 100 is determined by the frequency of periods $T_1$ and $T_2$, i.e. $1/T_1$ or $1/T_2$. The maximum clock frequency will be determined by the number of sampling capacitors and the settling time of the associated switches used in a particular filter embodiment, such that each sampling capacitor can sample the input and then settles before being switched into the feedback loop of the amplifier. Thus as more sampling capacitors are added, the maximum clock frequency would be reduced, provided the settling time of the switches remains constant. Typical operating frequencies, or notch filter frequencies, or in some applications the modulation frequency, may be in the range of 2 kHz to 2 MHz, although these frequencies may be larger or smaller depending on the exact application of the filter circuit. In one illustrative embodiment, the operating frequency of the filter 100 may be on the order of 100 kHz to 400 kHz. In this particular embodiment with four samples per clock cycle, i.e. four sampling capacitors in sampling and averaging portions 101, 102, the effective sampling frequency would be on the order of 400 kHz to 1600 kHz. In applications in which the notch filter 100 filters frequency components at a modulation frequency, the minimum notch frequency may be limited by the modulation frequency. The maximum notch frequency is typically limited by the gain-bandwidth product of the operational amplifier, which is dependent on the fabrication technology used to build the circuit.

The settling time associated with the switches and capacitors used for sampling and averaging determines the required duration of the different pulse widths (i.e., time period $T_1$ of clock signal 171, time period $T_3$ of clock signal 172, time period $T_4$ of clock signal 173, time period $T_2$ of clock signal 176, time period $T_5$ of clock signal 177, and time period $T_6$ of clock signal 178). In order to minimize the harmonic distortion and gain loss, the time constant of the resistance of the switches and the sampling capacitor s should be sized such that the signal settles to 99.9%, or whatever percentage is required for the allowable error limit of a particular filter, within the clock pulse width. The width of the clock pulses may be adjusted once the sampling capacitors and switches have been sized in a given filter design.

In some embodiments clock signals 171 and 176 may be the inverse of each other, for example clock signal 176 may be realized by passing clock signal 171 through an inverter. Such an embodiment would require any delay time from an inverter to be sufficiently small to place a capacitor in the feedback loop of the amplifier in order to prevent the amplifier from becoming unstable. If the switches were to leave the feedback path open, or without a sampling capacitor in the feedback path, for example if both 171 and 176 were in the low or "OFF" state in the above example, or where both sets of switches to the sampling capacitors were in an open or "off" state for a significant period of the clock cycle $T_{ck}$ then the output may become unstable. This may be avoided as described above if the time the feedback path is open is sufficiently small for a given filter embodiment. In other embodiments the amplifier may be instantaneously operating in an open loop configuration if both clock signals 171 and 176 are in the same state, for example the low state. This is acceptable provided the time period in which the two signals are in the same state (for example, both 171 and 176 are in the low state) is sufficiently small, such as a time of less than a few tens of milliseconds.

Reference node 117 may typically be coupled to ground, or another reference voltage as appropriate for a given circuit design that uses the notch filter of the present invention.

Figure 1E:
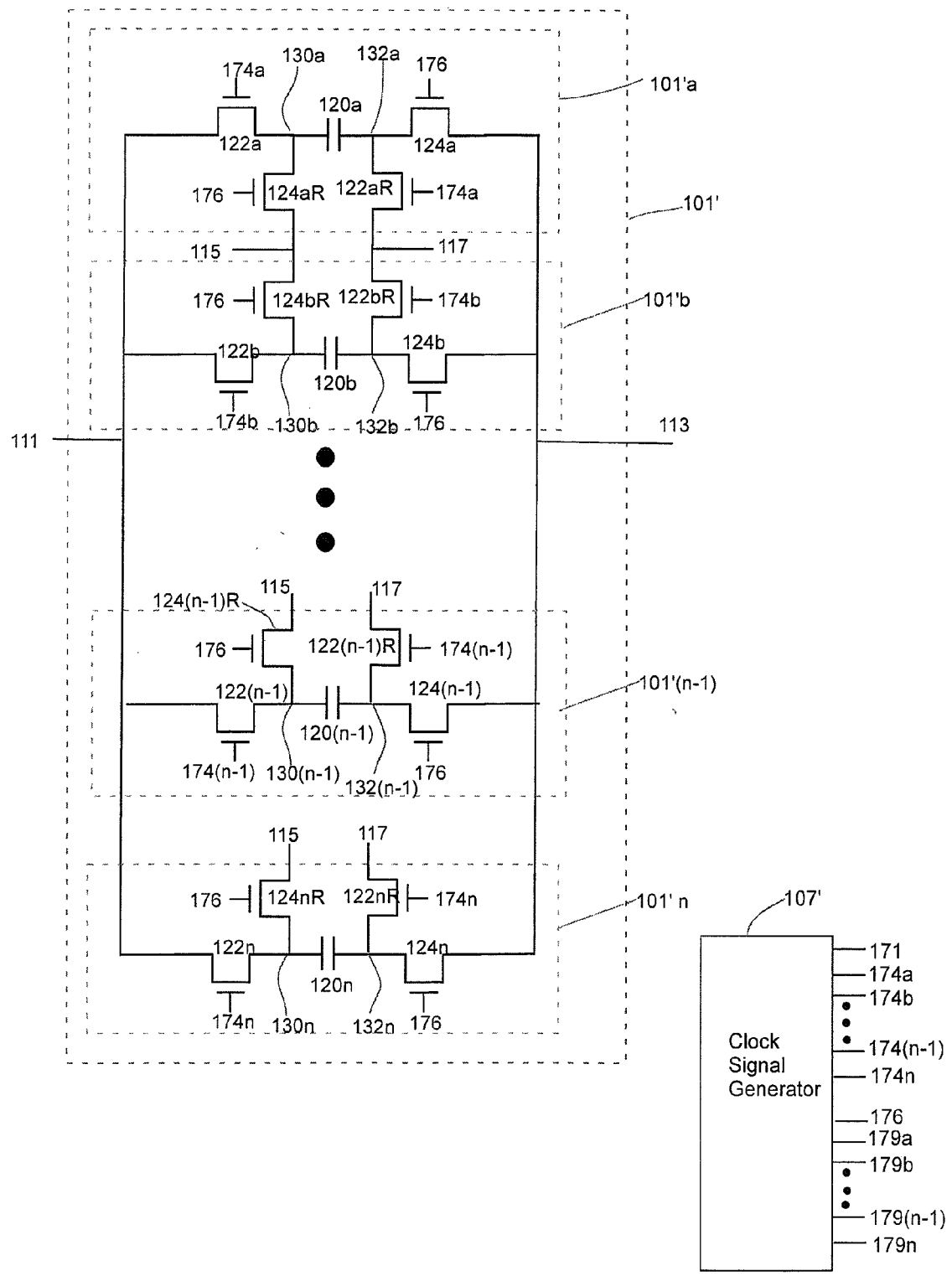
FIG. 1E shows an alternative sampling and averaging portion having n sampling capacitors for use in the filter of FIG. 1.
Figure 1F:
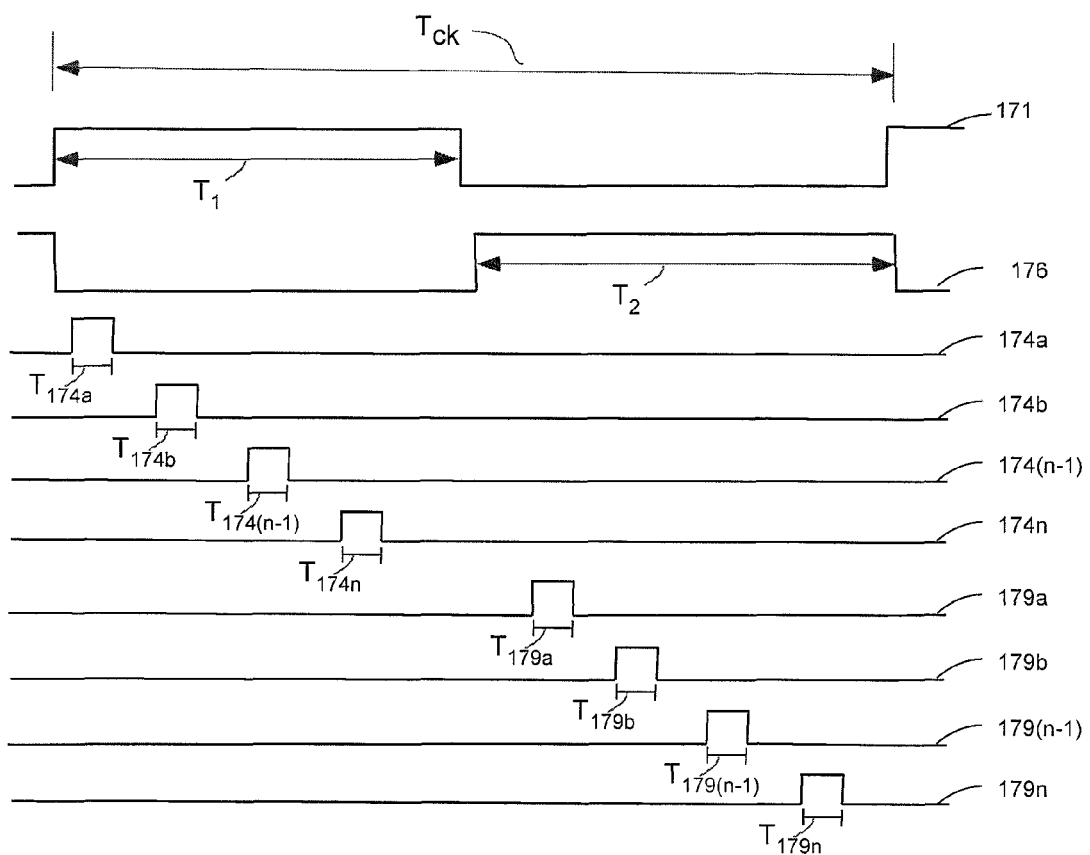
FIG. 1F shows illustrative clock signals for the switched capacitor sampling network of FIG. 1E.
Figure 1G:
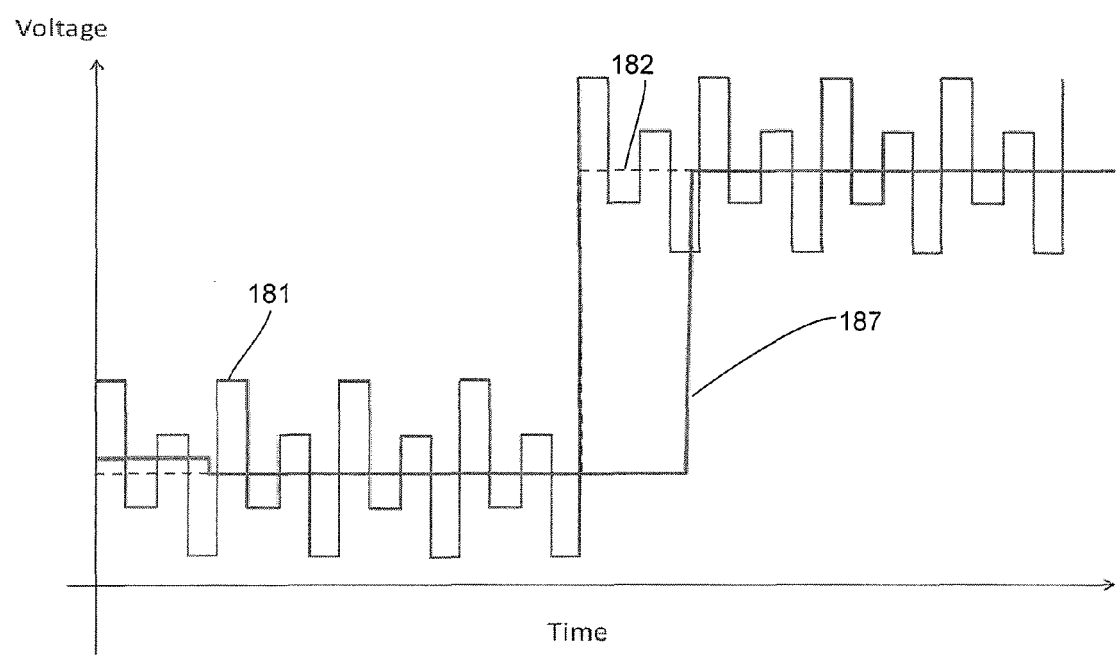
FIG. 1G shows an example of an input and output signal to the filter for the case of 4 input sampling capacitors.

In other embodiments there may be more than two switched capacitor sampling networks for each sampling and averaging portion 101 and 102. The sampling and averaging portions 101 and 102 of the notch filter 100 in FIG. 1 may have n sampling capacitor networks, for example sampling and averaging portion 101 may be replaced by sampling and averaging portion 101' which has 101'a, 101'b, ... 101' (n-1), and 101'n sampling capacitor networks as shown in FIG. 1E. Each sampling and averaging network has a switch 122a to 122n and 122aR to 122nR to connect the sampling capacitor 120a to 120n between the input node 111 and reference node 117 during non-overlapping time periods $T_{174a}$ to $T_{174n}$, which would occur during the time that clock $T_1$ of FIG. 1F is high, or in an "ON" state. Likewise, each sampling capacitor 120a to 120n has a pair of switches 124a to 124n and 124aR to 124nR that connect the sampling capacitors between the output node 105c and the common node 113 during time period $T_2$ represented by signal 176 in FIG. 1F. Circuit 102 would also need to be modified in a similar manner to match the number of sampling capacitors shown in FIG. 1E, creating circuit 102'. Signals 179a to 179n in FIG. 1F represent a timing arrangement for circuit 102' which operates in a similar manner as described for circuit 101' above, but during the time period $T_2$ when signal 176 is high. FIG. 1G shows an example of the input signal 181, an example of the averages 182 of the inputs, and output signal 187 for the case of n=4 switched sampling capacitors networks.

Another embodiment of the present invention is a running average version where the sampling capacitors in a sampling and averaging portion 101, 102, 101', or 102' are charged during different time periods and averaged in different time periods. An example of such an embodiment is provided in FIG. 1H with an associated timing diagram in FIG. 1I. Circuits 101 and 102 are replaced by circuits 101", 102" and 103" in the notch filter. Circuit 101" is similar in operation to circuit 101, with the exception that the timing of the switches is changed. Clock signal 193 controls the switches that connect the sampling capacitors 120a and 120b to the common node 113 and the output of the amplifier at node 115 during a first time period $T_A$. The input signal 181 is sampled by circuit portion 101" via node 111 at two different sampling times; sampling capacitor 120a is connected to the input node 111 during a fifth period $T_e$ represented by the signal 197, and sampling capacitor 120b is connected to the input node during a sixth time period $T_f$ represented by signal 198.

The sampling capacitors 140a and 140b of the circuit 102" are connected to the common node 113 and the output node 105c during a second time period $T_B$ and its signal 194. The input signal 181 is sampled by circuit portion 102" via node 111 at two different sampling times; sampling capacitor 140a is connected to the input node 111 during a fourth period $T_d$ represented by the signal 196, and sampling capacitor 140b is connected to the input node during the sixth time period $T_f$ represented by signal 198.

Figure 1H:
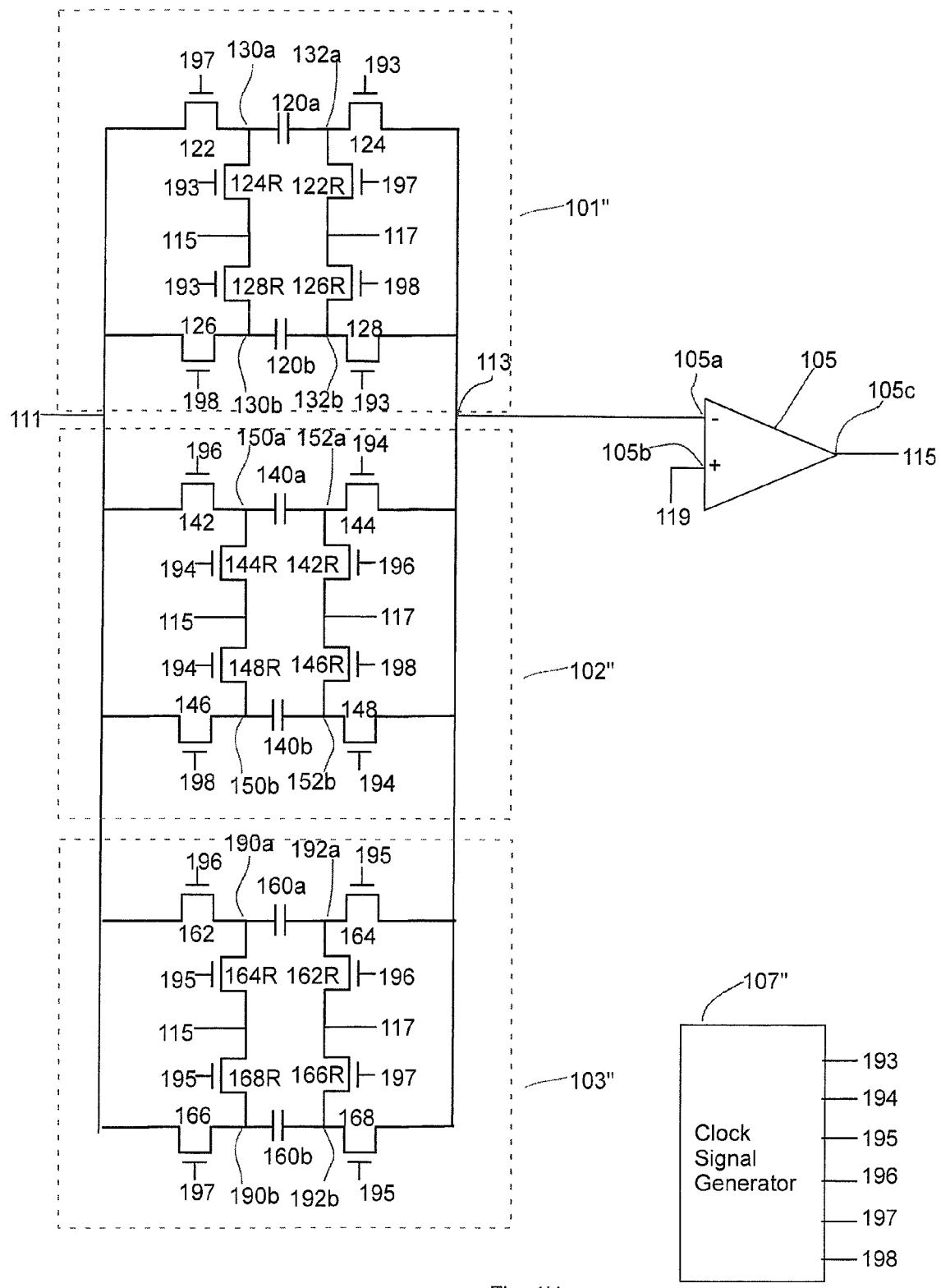
FIG. 1H shows an example of a running average embodiment of the filter.
Figure 1I:
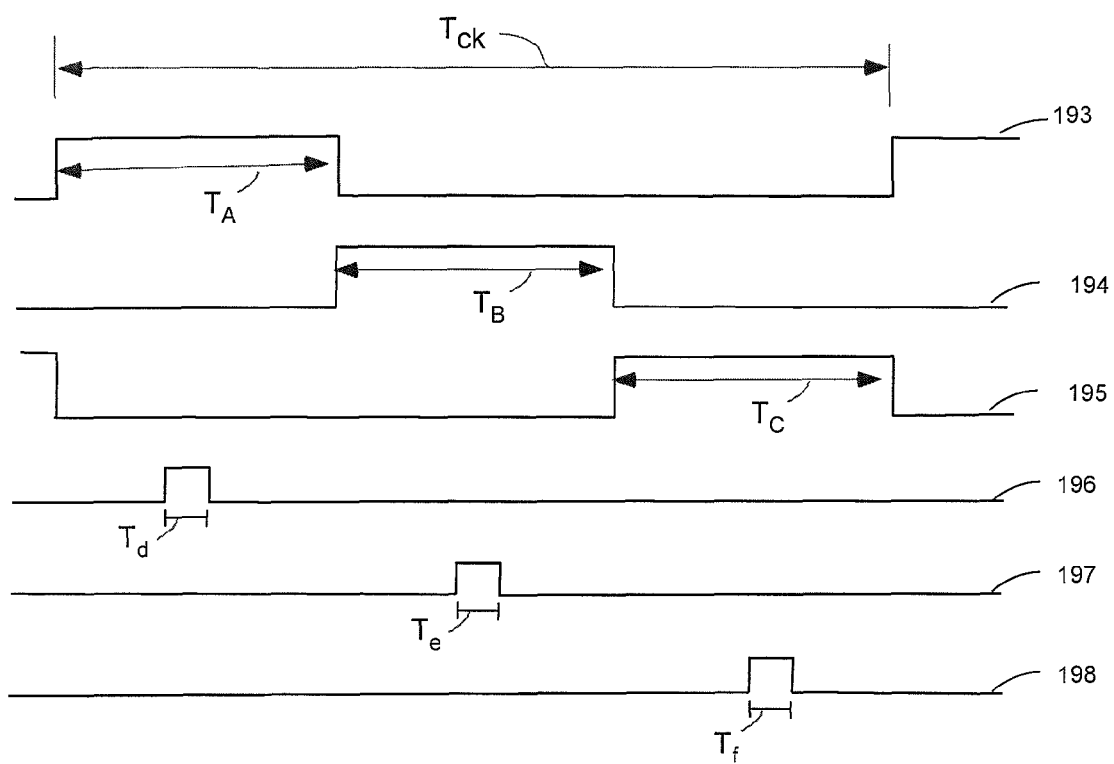
FIG. 1I shows illustrative clock signals for the circuit of FIG. 1H.

The sampling capacitors 160a and 160b of the circuit 103" are connected to the common node 113 and the output node 115 during a third time period $T_C$ and its signal 195. The input signal 181 is sampled by a circuit 103" via node 111 at two different sampling times; sampling capacitor 160a is connected to the input node 111 during a fourth period $T_d$ represented by the signal 196, and sampling capacitor 160b is connected to the input node during the fifth time period $T_e$ represented by signal 197. Switches 162, 162R, 164, 164R, 166, 166R, 168, and 168R operate in a similar manner to the switches previously described for sampling capacitor networks 101 and 102, but with different timing inputs 195 to 197 as shown in FIG. 1H.

Thus, during any one sampling portion $T_d$, $T_e$, or $T_f$ two sampling capacitors are charged by the input node 111. During an averaging portion $T_A$, $T_B$, or $T_C$ the sampling capacitors that are averaged are averaged from different input periods to the output of the notch filter at node 115. The running average embodiment has the advantage that the output is partially updated sooner than the completion of an entire time period $T_{ck}$. In certain embodiments the output will be changed in one period $T_A$, $T_B$, or $T_C$, which is approximately one third of the period $T_{ck}$.

Figure 2:
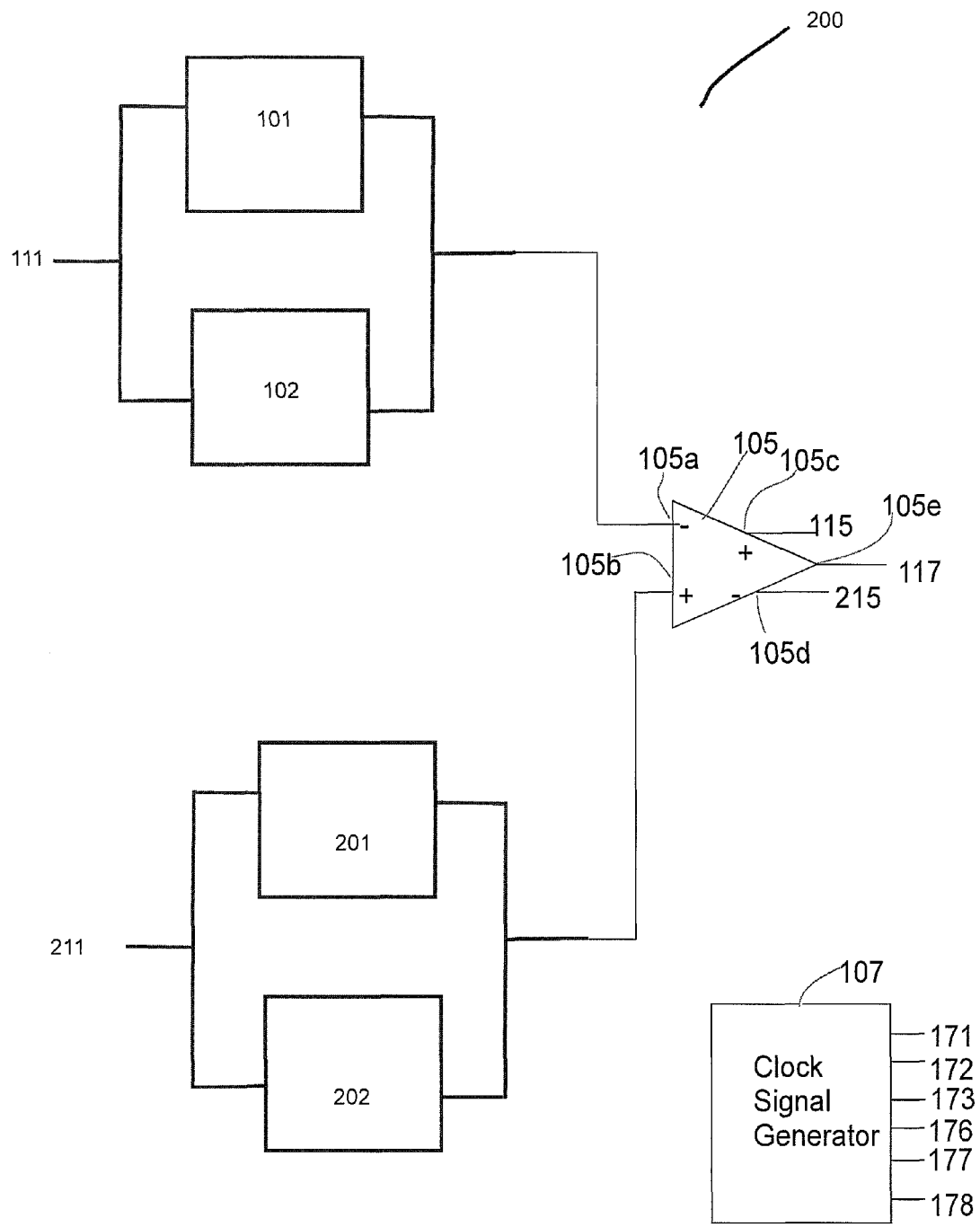
FIG. 2 is a schematic of a differential switched capacitor notch filter embodiment.
Figure 2A:
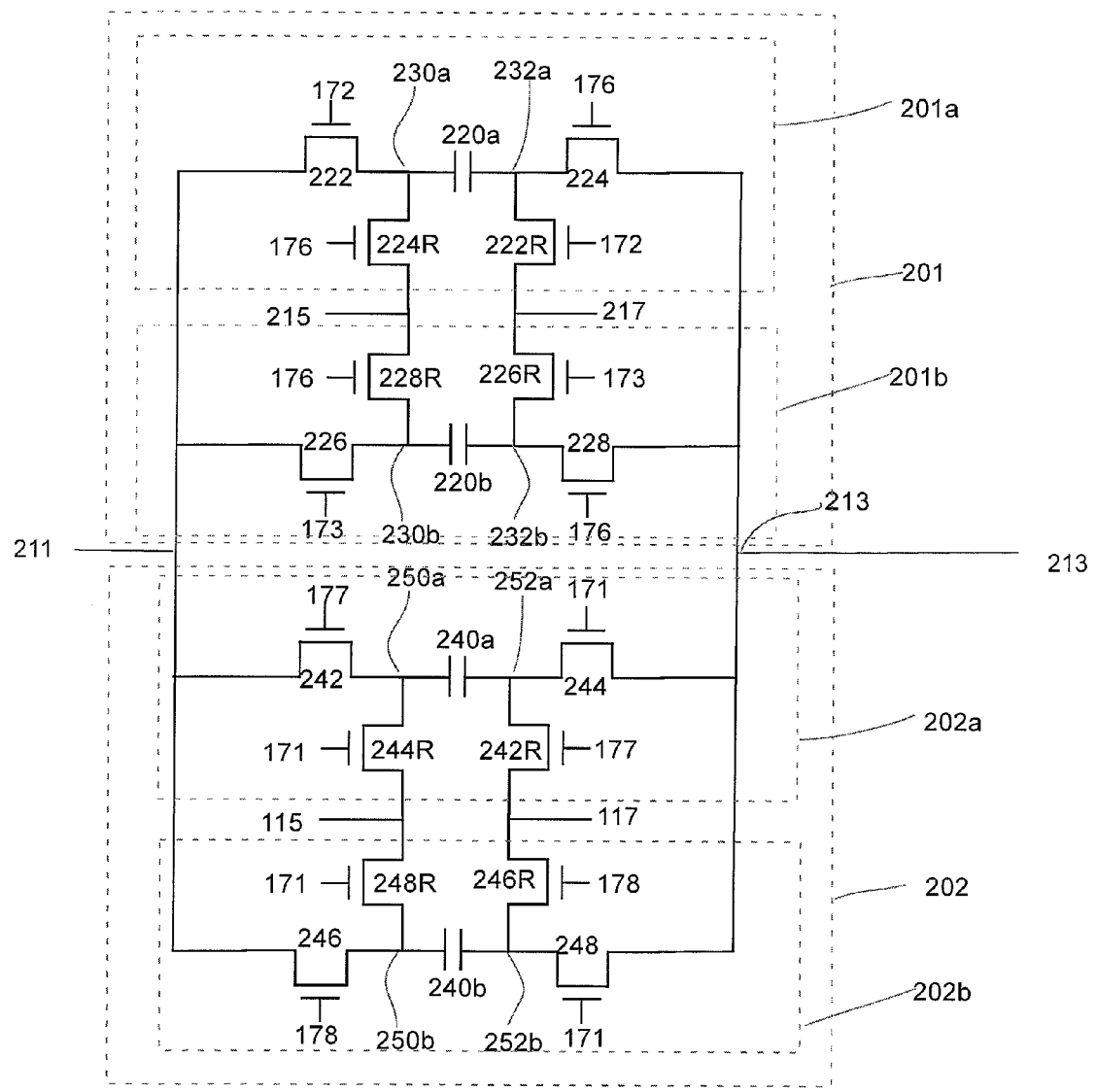
FIG. 2A is a schematic of the differential sampling networks 201 and 202 shown in FIG. 2.

According to a further aspect of the invention, a differential implementation notch filter 200 is shown in FIGS. 2, and 2A where like elements are referenced with like reference numbers. In the differential embodiments, the operational amplifier 105 has a differential output at nodes 115 and 215. Node 117 is a reference node, for example ground or a reference voltage equal to $V_{cc}/2$, where $V_{cc}$ is the supply voltage to the circuit. The filter 200 includes a second input node 211 adapted for receiving input signal similar to the input signal 181 shown in FIG. 1B, at least two differential sampling and averaging portions 201, 202, a differential common node 213 coupled to an input 105b of the operational amplifier 105. Each differential sampling and averaging portion 201 and 202 includes at least two differential switched capacitor sampling networks 201a, 201b, 202a, 202b, respectively. The number of sampling networks in each portion 201, 202 corresponds to the number of input signal samples that are processed (i.e., averaged).

Each switched capacitor differential sampling network 201a, 201b, 202a, 202b comprises a respective differential sampling capacitor and associated differential switches. More particularly, the first differential switched capacitor sampling network 201a includes a first differential sampling capacitor 220a and associated differential switches 222, 222R, 224, and 224R; the second differential switched capacitor sampling network 201b includes a second differential sampling capacitor 220b and associated differential switches 226, 226R, 228, and 228R; the third differential switched capacitor sampling network 202a includes a third differential sampling capacitor 240a and associated differential switches 242, 242R, 244, and 244R; and the fourth differential switched capacitor sampling network 202b includes a fourth differential sampling capacitor 240b and associated differential switches 246, 246R, 248, and 248R. The first differential sampling capacitor 220a has a first terminal 230a coupled to a first differential switch 222 to selectively couple the first differential sampling capacitor to the second input terminal 211 and a second terminal 232a coupled to a second differential switch 224 to selectively couple the first differential sampling capacitor to the differential common node 213. The second terminal 232a of the first differential sampling capacitor 220a is also selectively coupled to a differential reference node 217 by a first differential reference switch 222R. The first terminal 230a of the first differential sampling capacitor 220a is selectively coupled to the second output node 215 of the amplifier 105 by a second differential reference switch 224R. In some embodiments the differential reference node 217 and the reference node 117 are at the same potential.

The second differential sampling capacitor 220b has a first terminal 230b coupled to a third differential switch 226 to selectively couple the second differential sampling capacitor 220b to the second input terminal 211 and a second terminal 232b coupled to a fourth differential switch 228 to selectively couple the second differential sampling capacitor 220b to the differential common node 213. The second terminal 232b of the second differential sampling capacitor 220b is also selectively coupled to the differential reference node 217 by a third differential reference switch 226R. The first terminal 230b of the second differential sampling capacitor 220b is selectively coupled to the second output node 215 of the amplifier 105 by a fourth differential reference switch 228R.

The third differential sampling capacitor 240a has a first terminal 250a coupled to a fifth differential switch 242 to selectively couple the third differential sampling capacitor to the second input terminal 211 and a second terminal 252a coupled to a sixth differential switch 244 to selectively couple the third differential sampling capacitor 240a to the differential common node 213. The second terminal 252a of the third differential sampling capacitor 240a is also selectively coupled to the differential reference node 217 by a fifth differential reference switch 242R. The first terminal 250a of the third differential sampling capacitor 240a is selectively coupled to the second output node 215 of the amplifier 105 by a sixth differential reference switch 244R.

The fourth differential sampling capacitor 240b has a first terminal 250b coupled to a seventh differential switch 246 to selectively couple the fourth differential sampling capacitor 240b to the second input terminal 211 and a second terminal 252b coupled to an eighth differential switch 248 to selectively couple the fourth differential sampling capacitor 240b to the differential common node 213. The second terminal 252b of the fourth differential sampling capacitor 240b is also selectively coupled to the differential reference node 217 by a seventh differential reference switch 246R. The first terminal 250b of the second differential sampling capacitor 240b is selectively coupled to the second output node 215 of the amplifier 105 by an eighth differential reference switch 248R.

The filter 200 further includes clock generator 107 adapted to provide clock signals for controlling the various switches, such as the illustrative signals shown and described above in connection with FIG. 1A. In particular, a first clock signal 171 is provided to close the sixth differential switch 244, the sixth differential reference switch 244R, eighth differential switch 248 and the eighth differential reference switch 248R during a first portion of each clock cycle.

The clock signal generator 107 further provides a second clock signal 172 to close the first differential switch 222 and the first differential reference switch 222R during a third portion of each clock cycle and a third, non-overlapping clock signal 173 to close the third differential switch 226 and the third differential reference switch 226R during a fourth portion of each clock cycle. Clock signals 172 and 173 are both active during the time clock signal 171 is active.

The clock signal generator further provides a fourth clock signal 176 to close the second differential switch 224, the second differential reference switch 224R, the fourth differential switch 228 and the fourth differential reference switch 228R during a second portion of each clock cycle. A fifth clock signal 177 is provided to close the fifth differential switch 242 and the fifth differential reference switch 242R during a fifth portion of each clock cycle and a sixth, non-overlapping clock signal 178 to close the seventh differential switch 246 and the seventh differential reference switch 246R during a sixth portion of each clock cycle. Clock signals 177 and 178 are both active during the time clock signal 176 is active.

In operation, during a first portion of each clock cycle the differential sampling capacitors 220a, 220b are alternately charged during non-overlapping time periods while differential capacitors 240a, 240b are averaged and their averaged charge transferred to the filter output. Similarly, during a second portion of each clock cycle (that is non-overlapping with respect to the first portion), differential sampling capacitors 240a, 240b are alternately charged during non-overlapping time periods while charge in differential capacitors 220a, 220b are averaged and their averaged charge transferred to the filter output.

More particularly, during a first portion $T_1$ of each clock cycle $T_{ck}$ (herein the first time period), the first clock signal 171 is in a logic state, here high, to close controlled differential switches 244, 244R, 248, 248R. It is during the first time period $T_1$ that the charge on the third and fourth differential sampling capacitors 240a, 240b is averaged as the charge is simultaneously transferred from the differential sampling capacitors to the second filter output 215. In other words, during the first time period, differential sampling capacitors 240a, 240b are coupled in parallel from the differential common node 213 to the second amplifier output 215, so that the feedback network of the operational amplifier 105 includes the differential sampling capacitors 240a, 240b coupled between the amplifier input node 105b and second output node 105d.

During the second portion $T_2$ of each clock cycle (herein the second time period) the second clock signal 176 is in a logic state, here high, to close controlled differential switches 224, 224R, 228, 228R. It is during the second time period $T_2$ that the charge on the first and second differential sampling capacitors 220a, 220b is averaged as the charge is simultaneously transferred from the sampling capacitors to the second filter output 215. In other words, during the second time period, differential sampling capacitors 220a, 220b are coupled in parallel from the differential common node 213 to the second amplifier output 215 so that the feedback network of the operational amplifier 105 includes the differential sampling capacitors 220a, 220b coupled between the amplifier input node 105b and second output node 105d.

During a third portion of each clock cycle $T_3$ (herein the third time period) which occurs during the first time period $T_1$ clock signal 172 closes differential switches 222 and 222R. Thus, during the third time period $T_3$, the first differential sampling capacitor 220a is coupled between the differential input terminal 211 and the differential reference node 217.

During a fourth portion $T_4$ of each clock cycle $T_{ck}$ (herein the fourth time period), the fourth clock signal 173 is in a logic state, here high, to close controlled differential switches 226, 226R. Thus, during the fourth time period $T_4$, the second differential sampling capacitor 220b is coupled to the second input terminal 211 and the differential reference node 217. Thus, during the third time period $T_3$, differential sampling capacitor 220a is charged by a differential input signal at terminal 211 which is similar to the input signal 181 from FIG. 1D or 1G and during the fourth time period $T_4$, differential sampling capacitor 220b is charged by the differential input signal at terminal 211.

During a fifth portion of each clock cycle $T_5$ (herein the fifth time period), which occurs during the second time period $T_2$, clock signal 177 closes differential switches 242 and 242R. Thus, during the fifth time period $T_5$, the third differential sampling capacitor 240a is coupled between the second input terminal 211 and the differential reference node 217.

During a sixth portion $T_6$ of each clock cycle $T_{ck}$ (herein the sixth time period) the sixth clock signal 178 is in a logic state, here high, to close controlled differential switches 246, 246R. Thus, during the sixth time period $T_6$, the fourth differential sampling capacitor 240b is coupled to the second input terminal 211 and the differential reference node 217. Thus, during the fifth time period $T_5$, differential sampling capacitor 240a is charged a differential input signal at terminal 211 and during the sixth time period $T_6$, differential sampling capacitor 240b is charged by a differential input signal at terminal 211.

It will be appreciated by those of ordinary skill in the art that while the differential notch filter embodiment is shown to have two switched capacitor sampling networks coupled to each input terminal 111, 211, other numbers of switched capacitor sampling networks may be used. It will be further understood that although each sampling network 101a, 101b, 201a, 201b is shown to include two sampling capacitors, more sampling capacitors can be used in each sampling network.

As is known, there are a variety of types of magnetic field sensing elements, including, but not limited to, Hall Effect elements, including, for example, a planar Hall element, and a vertical Hall element. Hall Effect elements generate an output voltage proportional to a magnetic field. The material used for a Hall element may include, but is not limited to, Si, GaAs, InGaAsP, InSb, InAs, Ge, SiGe, or other semiconductor materials.

Magnetic field sensors, i.e., circuits that use magnetic field sensing elements, are used in a variety of applications, including, but not limited to, a current sensor that senses a magnetic field generated by a current carried by a current-carrying conductor, a linear magnetic sensor that generates an analog or digital output in proportion to the strength of a magnetic field, a magnetic switch that senses the proximity of a ferromagnetic object, a rotation detector that senses passing ferromagnetic articles, for example magnetic domains of a ring magnet, and a magnetic field sensor that senses a magnetic field density of a magnetic field.

Many transducers including Hall Effect elements tend to be limited in accuracy by a variety of factors, including, but not limited to, the DC offset of the output signal from the Hall Effect element. Having a DC offset, the Hall Effect element or other magnetic field such as a magnetoresistance element generates an output signal representative of a non-zero magnetic field when in the presence of a zero magnetic field. Particularly for small sensed magnetic fields, the offset can result in a substantial error.

A variety of techniques are used to reduce a DC offset associated with a magnetic field sensing element, for example, techniques described in U.S. Pat. No. 5,621,319 entitled "Chopped Hall Sensor with Synchronously Chopped Sample and Hold Circuit," which issued on Apr. 15, 1997; techniques described in U.S. Pat. No. 7,425,821 entitled "Chopped Hall Effect Sensor," which issued on Sep. 16, 2008; techniques described in U.S. Pat. No. 7,605,647 entitled "Chopper-Stabilized Amplifier and Magnetic Field Sensor," which issued on Oct. 20, 2009, each of which is assigned to the assignee of the present invention, and each of which is incorporated by reference herein in its entirety.

In order to improve the performance of a chopped Hall Effect sensor, a sin c, or notch filter may be useful for example as is described in U.S. Pat. No. 7,425,821. The notch filter of the present invention is particularly desirable since it may have a reduced size when compared to previous such filters.

The size reduction is due to the simultaneous averaging and transferring of the capacitor charge (thereby eliminating the need for a buffering stage) and also possibly due to the elimination of a smoothing filter in applications in which the low pass filtering provided by the described notch filter suffices. Additionally, the described notch filters have a faster response time than heretofore achievable because sampling and charge averaging or transfer takes place simultaneously. During the time that the sampling networks 201a and 201b are sampling the input, the networks 101a, 101b are placed in the feedback of the filter to transfer charge, thereby sampling the input with one set of sampling networks occurs while the charge transfer and averaging takes place with another set of networks.

Figure 3:
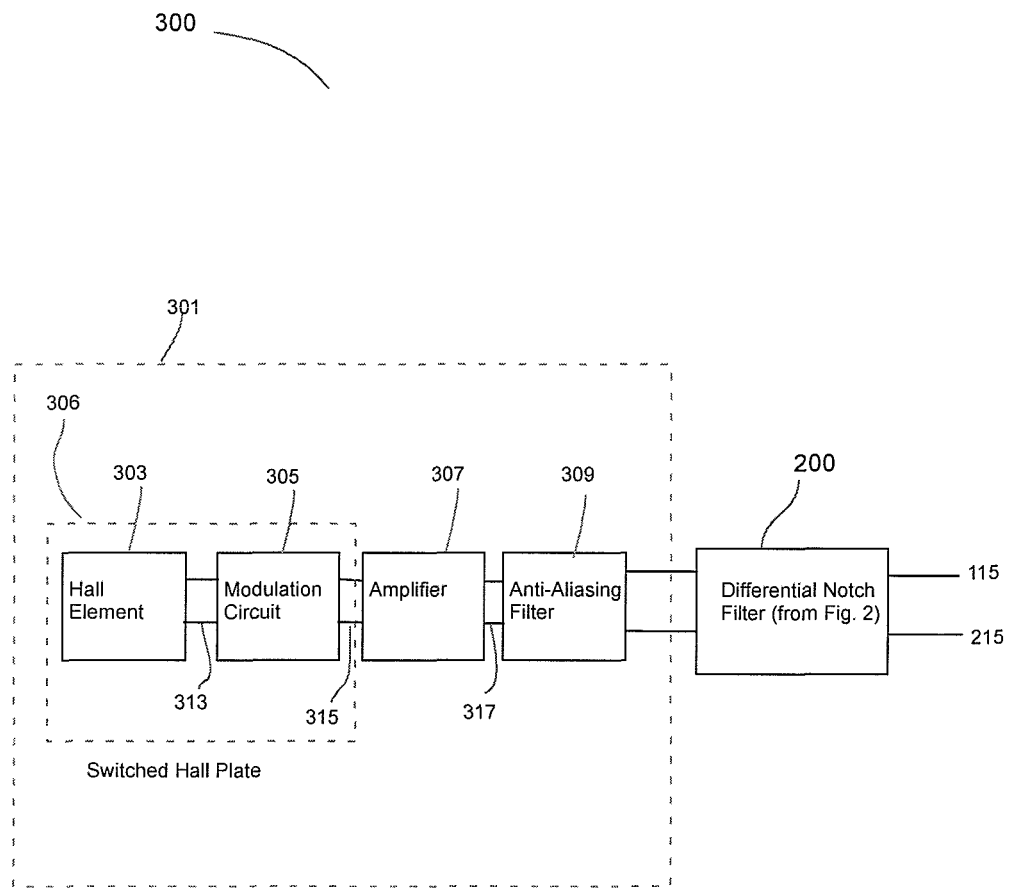
FIG. 3 is a schematic of a chopped Hall sensor including a switched capacitor notch filter.

Referring now to FIG. 3 a chopped Hall Effect sensor 300 includes differential notch filter 200 (FIG. 2) and a Hall plate circuit 301. The transducer 303 here shown as a Hall element may include but is not limited to a planar Hall element, or a vertical Hall element. Alternatively the Hall element may be replaced by a magnetoresistive element (e.g., including but not limited to, an anisotropic magnetoresistance (AMR) element, a giant magnetoresistance (GMR) element, a tunneling magnetoresistance element (TMR)), or general transducer (for example an accelerometer, flow sensor, or pressure sensor)). The Hall element 303 has an output 313 that varies in accordance with a sensed magnetic field and a Hall modulation circuit 305 is responsive to the output 313 and provides a modulation circuit output signal at an output 315. The Hall element 303 and the Hall modulation circuit 305 combine to form a switched Hall plate 306. The modulation circuit output signal 315 is coupled to the input of amplifier stage 307 which may include a chopped amplifier. In some embodiments an anti-aliasing filter 309 may be coupled between the amplifier output 317 and inputs 111 and 211 to the differential notch filter 200. The anti-aliasing filter 309 removes frequency components above the modulation frequency to ensure that the notch filter meets the Nyquist criterion for noise signals. The notch or operating frequency of the notch filter 200 is selected to remove the modulated offset signal component (ripple) and thus is tuned to the modulation frequency at which the offset signal component is modulated when it reaches the notch filter. In some embodiments, such as those in which the Hall modulation circuit 305 modulates the magnetic signal component rather than the offset signal component, a set of demodulation switches (not shown) may be required between the amplifier 307 and the anti-aliasing filter 309 as described in U.S. Pat. No. 7,425,821.

In another embodiment a four phase chopper Hall Effect circuit may be implemented. In this case there would be four switched capacitor sampling networks in each sampling network 101 and 201.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A switched capacitor notch filter, comprising:
an operational amplifier having a first input node coupled to a common node, a second input node, and an output node at which an output signal of the filter is provided;
a first sampling capacitor having a first terminal selectively coupled to an input node of the switched capacitor notch filter for receiving an input signal by a first switch and having a second terminal selectively coupled to the common node by a second switch;
a second sampling capacitor having a first terminal selectively coupled to the input signal by a third switch and having a second terminal selectively coupled to the common node by a fourth switch;
a first reference switch coupled between the second terminal of said first sampling capacitor and a reference node;
a second reference switch coupled between the first terminal of the first sampling capacitor and said output node of the operational amplifier;
a third reference switch coupled between the second terminal of said second sampling capacitor and said reference node;
a fourth reference switch coupled between the first terminal of the second sampling capacitor and said output node of the operational amplifier;
a third sampling capacitor having a first terminal selectively coupled to the input signal by a fifth switch and having a second terminal selectively coupled to the common node by a sixth switch;
a fourth sampling capacitor having a first terminal selectively coupled to the input signal by a seventh switch and having a second terminal selectively coupled to the common node by an eighth switch;
a fifth reference switch coupled between the second terminal of said third sampling capacitor and said reference node;
a sixth reference switch coupled between the first terminal of the third sampling capacitor and said output node of the operational amplifier;
a seventh reference switch coupled between the second terminal of said fourth sampling capacitor and said reference node; and
an eighth reference switch coupled between the first terminal of the fourth sampling capacitor and said output node of the operational amplifier.

2. The filter of claim 1 further comprising a clock signal generator for providing a first clock signal to close the sixth switch, the sixth reference switch, the eighth switch, and the eighth reference switch during a first portion of each clock cycle and a second clock signal to close the second switch, the second reference switch, the fourth switch, and the fourth reference switch during a second portion of each clock cycle.

3. The filter of claim 2 wherein the first and second clock signals are non-overlapping.

4. The filter of claim 2 wherein the clock signal generator further provides a third clock signal to close the first switch and the first reference switch, a fourth clock signal clock signal to close the third switch and the third reference switch, a fifth clock signal to close the fifth switch and the fifth reference switch, and a sixth clock signal to close the seventh switch and the seventh reference switch, wherein the third and fourth clock signals overlap with the first clock signal and the fifth and sixth clock signals overlap with the second clock signal.

5. The filter of claim 3 wherein the second clock signal is the inverse of the first clock signal.

6. The filter of claim 4 further comprising a fifth sampling capacitor and a sixth sampling capacitor coupled in parallel with the first and second sampling capacitors between the common node and the output node of the operational amplifier during the second portion of each clock cycle and further comprising a seventh sampling capacitor and an eighth sampling capacitor coupled in parallel with the third sampling capacitor and the fourth sampling capacitor between the common node and the output node of the operational amplifier during time first portion of each clock cycle.

7. The filter of claim 6 wherein the clock signal generator further provides a seventh clock signal to couple the fifth sampling capacitor to the input terminal, an eight clock signal to couple the sixth sampling capacitor to the input terminal, a ninth clock signal to couple the seventh sampling capacitor to the input terminal and a tenth clock signal to couple the eighth sampling capacitor to the input terminal, wherein the seventh and eight clock signals overlap with the first clock signal and the ninth and tenth clock signals overlap with the second clock signal.

8. The filter of claim 2 further comprising a fifth sampling capacitor and a sixth sampling capacitor and wherein the clock signal generator further provides a third clock signal to couple the fifth sampling capacitor and the sixth sampling capacitor in parallel between the common node and the output node of the operational amplifier during a third portion of each clock cycle.

9. The filter of claim 8 wherein the first, second, and third clock signals are non-overlapping.

10. The filter of claim 1 wherein the operational amplifier has a second output node and a reference node and wherein the filter further comprises:
a first differential sampling capacitor having a first terminal selectively coupled to a second input signal by a first differential switch and having a second terminal selectively coupled to a differential common node by a second differential switch;
a second differential sampling capacitor having a first terminal selectively coupled to the second input signal by a third differential switch and having a second terminal selectively coupled to the differential common node by a fourth differential switch;
a first differential reference switch coupled between the second terminal of said first differential sampling capacitor and said reference node;
a second differential reference switch coupled between the first terminal of the first differential sampling capacitor and said second output node of the operational amplifier;
a third differential reference switch coupled between the second terminal of said second differential sampling capacitor and said reference node;
a fourth differential reference switch coupled between the first terminal of the second differential sampling capacitor and said second output node of the operational amplifier;
a third differential sampling capacitor having a first terminal selectively coupled to the second input signal by a fifth differential switch and having a second terminal selectively coupled to the differential common node by a sixth differential switch;
a fourth differential sampling capacitor having a first terminal selectively coupled to the second input signal by a seventh differential switch and having a second terminal selectively coupled to the differential common node by an eighth differential switch;
a fifth differential reference switch coupled between the second terminal of said third differential sampling capacitor and said reference node;
a sixth differential reference switch coupled between the first terminal of the third differential sampling capacitor and said second output node of the operational amplifier;
a seventh differential reference switch coupled between the second terminal of said fourth differential sampling capacitor and said reference node; and
an eighth differential reference switch coupled between the first terminal of the fourth differential sampling capacitor and said second output node of the operational amplifier.

11. The filter of claim 10 further comprising a clock signal generator for providing a first clock signal to close the sixth differential switch, the sixth differential reference switch, the eighth differential switch, and the eighth differential reference switch during a first portion of each clock cycle and a second clock signal to close the second differential switch, the second differential reference switch, the fourth differential switch, and the fourth differential reference switch during a second portion of each clock cycle.

12. The filter of claim 11 wherein the first and second clock signals are non-overlapping.

13. The filter of claim 11 wherein the clock signal generator further provides a third clock signal to close the first differential switch and the first differential reference switch, a fourth clock signal clock signal to close the third differential switch and the third differential reference switch, a fifth clock signal to close the fifth differential switch and the fifth differential reference switch, and a sixth clock signal to close the seventh differential switch and the seventh differential reference switch, wherein the third and fourth clock signals overlap with the first clock signal and the fifth and sixth clock signals overlap with the second clock signal.

14. The filler of claim 12 wherein the second clock signal is the inverse of the first clock signal.

15. The filter of claim 13 further comprising a fifth differential sampling capacitor and a sixth differential sampling capacitor coupled in parallel with the first and second differential sampling capacitors between the differential common node and the second output node of the operational amplifier during the second portion of each clock cycle and further comprising a seventh differential sampling capacitor and an eighth differential sampling capacitor coupled in parallel with the third differential sampling capacitor and the fourth differential sampling capacitor between the differential common node and the second output node of the operational amplifier during the first portion of each clock cycle.

16. The filter of claim 15 wherein the clock signal generator further provides a seventh clock signal to couple the fifth differential sampling capacitor to the second input terminal, an eight clock signal to couple the sixth differential sampling capacitor to the second input terminal, a ninth clock signal to couple the seventh differential sampling capacitor to the second input terminal and a tenth clock signal to couple the eighth sampling capacitor to the second input terminal, wherein the seventh and eight clock signals overlap with the first clock signal and the ninth and tenth clock signals overlap with the second clock signal.

17. The filter of claim 16 wherein the first and second input signals to the notch filter are provided by a magnetic field sensor circuit.

18. The filter of claim 17 wherein the magnetic field sensing circuit includes a switched Hall circuit.

19. The filter of claim 10 further comprising a fifth differential sampling capacitor and a sixth differential sampling capacitor and wherein the clock signal generator further provides a third clock signal to couple the fifth differential sampling capacitor and the sixth differential sampling capacitor in parallel between the differential common node and the second output node of the operational amplifier during a third portion of each clock cycle.

20. The filter of claim 19 wherein the first, second, and third clock signals are non overlapping.

21. A switched capacitor notch filter comprising:
an operational amplifier having a first input node coupled to a common node, a second input node and an output node at which an output signal of the filter is provided;
a first set of at least two sampling capacitors selectively coupled between an input node of the switched capacitor notch filter, the output node and the common node, wherein the first set of at least two sampling capacitors is coupled between an input signal received at the input signal and a reference node during a first time period for alternately sampling the input signal during the first time period and is coupled between the common node and the output node of the operational amplifier during a second time period; and a second set of at least two sampling capacitors selectively coupled between the input node of the switched capacitor notch filter, the output node and the common node, wherein the second set of at least two sampling capacitors is coupled between the input signal and a reference node during the second time period for alternately sampling the input signal during the second time period and is coupled between the common node and the output node of the operational amplifier during the first time period.

22. The notch filter of claim 21 wherein the input signal to the notch filter is provided by a magnetic field transducer.

23. The notch filter of claim 22 wherein the magnetic field transducer is a chopped Hall sensor.

24. The notch filter of claim 21 wherein the filter comprises at least eight sampling capacitors.

* * * * *

UNITED STATES PATENT AND TRADEMARK OFFICE
CERTIFICATE OF CORRECTION

PATENT NO. : 8,416,014 B2
APPLICATION NO. : 12/722753
DATED : April 9, 2013
INVENTOR(S) : Hernan D. Romero It is certified that error appears in the above-identified patent and that said Letters Patent is hereby corrected as shown below:

In the Claims

Column 14, lines 50-51 delete "clock signal clock signal" and replace with --clock signal--.

Column 15, line 5 delete "an eight clock signal" and replace with --an eighth clock signal--.

Column 15, lines 9-10 delete "seventh and eight clock" and replace with --seventh and eighth clock--.

Column 16, line 15 delete "fourth clock signal clock signal" and replace with --fourth clock signal--.

Column 16, line 23 delete "the filler of claim 12" and replace with --the filter of claim 12--.

Column 16, line 38 delete "an eight clock signal" and replace with --an eighth clock signal--.

Column 16, line 43 delete "wherein the seventh and eight" and replace with --wherein the seventh and eighth--.

Signed and Sealed this
Sixteenth Day of December, 2014

Michelle K. Lee
*Deputy Director of the United States Patent and Trademark Office*